US008707898B2

(12) United States Patent
Wehr et al.

(10) Patent No.: US 8,707,898 B2
(45) Date of Patent: Apr. 29, 2014

(54) APPARATUS FOR FANFOLDING MEDIA

(75) Inventors: Mary Ann Wehr, Hamilton, OH (US); Paul C. Blank, La Crosse, WI (US); Timothy W. Rawlings, Waynesville, OH (US); Richard D. Puckett, Miamisburg, OH (US); Patricia A. Puckett, legal representative, Miamisburg, OH (US)

(73) Assignee: NCR Corporation, Duluth, GA (US)

( * ) Notice: Subject to any disclaimer, the term of this patent is extended or adjusted under 35 U.S.C. 154(b) by 1498 days.

(21) Appl. No.: 12/051,423

(22) Filed: Mar. 19, 2008

(65) Prior Publication Data

US 2009/0199527 A1 Aug. 13, 2009

Related U.S. Application Data

(60) Provisional application No. 61/028,380, filed on Feb. 13, 2008.

(51) Int. Cl.

| | |
|---|---|
| ***B05C 11/00*** | (2006.01) |
| ***B05C 1/00*** | (2006.01) |
| ***B41J 2/32*** | (2006.01) |
| ***B42D 15/00*** | (2006.01) |
| *C23C 14/54* | (2006.01) |
| *B05D 1/28* | (2006.01) |

(52) U.S. Cl.
USPC ............ 118/713; 118/46; 118/249; 118/712; 427/10; 427/428.21; 347/171; 283/61

(58) Field of Classification Search
USPC ............ 118/712, 712.713, 46, 249; 427/256; 156/277; 347/171; 503/200; 283/61
See application file for complete search history.

(56) References Cited

U.S. PATENT DOCUMENTS

| | | | | |
|---|---|---|---|---|
| 5,130,292 | A * | 7/1992 | Ito et al. | 503/227 |
| 5,516,865 | A * | 5/1996 | Urquiola | 526/329.7 |
| 5,815,191 | A * | 9/1998 | Michielsen et al. | 347/188 |
| 5,898,017 | A * | 4/1999 | Chang | 503/204 |
| 5,984,363 | A * | 11/1999 | Dotson et al. | 283/61 |
| 6,118,956 | A * | 9/2000 | Hirao | 399/85 |
| 6,258,746 | B1 * | 7/2001 | Mehta et al. | 503/204 |
| 6,759,366 | B2 * | 7/2004 | Beckerdite et al. | 503/200 |
| 6,784,906 | B2 * | 8/2004 | Long et al. | 347/171 |
| 6,803,344 | B2 * | 10/2004 | Halbrook et al. | 503/200 |
| 6,906,735 | B2 * | 6/2005 | Bhatt et al. | 347/175 |
| 7,464,645 | B2 * | 12/2008 | Jeschonneck et al. | 101/484 |
| 7,531,224 | B2 | 5/2009 | Rawlings et al. | |
| 7,764,299 | B2 * | 7/2010 | VanDemark | 347/171 |
| 8,211,826 | B2 | 7/2012 | Keeton et al. | |
| 2002/0053320 | A1 * | 5/2002 | Duthaler et al. | 118/249 |
| 2004/0252145 | A1 * | 12/2004 | Van Doorn et al. | 347/5 |
| 2006/0072001 | A1 * | 4/2006 | Klein | 347/171 |
| 2007/0141263 | A1 * | 6/2007 | Schaefer | 427/355 |
| 2007/0211094 | A1 * | 9/2007 | Roth et al. | 347/14 |
| 2007/0267146 | A1 * | 11/2007 | Vigunas et al. | 156/443 |
| 2009/0015647 | A1 | 1/2009 | Rawlings et al. | |
| 2009/0015649 | A1 | 1/2009 | Keeton et al. | |

(Continued)

*Primary Examiner* — Dah-Wei D Yuan
*Assistant Examiner* — Karl Kurple
(74) *Attorney, Agent, or Firm* — Paul W. Martin

(57) ABSTRACT

Fanfold and/or perforated media comprising a substrate including one or more friable coatings and an overcoat covering at least a portion of the one or more friable coatings proximate to one or more associated fanfolds and/or perforations is provided, wherein the overcoat mitigates spallation of the one or more friable coatings. Methods and apparatus for making the same are also disclosed.

15 Claims, 9 Drawing Sheets

(56) References Cited

U.S. PATENT DOCUMENTS

2009/0163363 A1* 6/2009 Moreland et al. ............. 503/201
2009/0236844 A1* 9/2009 Boom et al. .................... 283/67
2010/0136277 A1* 6/2010 Hodsdon et al. ............. 428/41.8
2011/0267637 A1* 11/2011 Oza .............................. 358/1.14

* cited by examiner

APPARATUS FOR FANFOLDING MEDIA

CROSS REFERENCE TO RELATED APPLICATIONS

This application claims priority to U.S. Provisional Application No. 61/028,380 entitled "FANFOLD MEDIA DUST INHIBITOR" and filed on Feb. 13, 2008, the entire contents of which are hereby incorporated by reference herein for all purposes.

BACKGROUND

Print media may comprise one or more coatings to permit and/or facilitate the printing thereof by one or more means such as, but not limited to, thermal printing, inkjet printing, laser printing and the like. Thermal printing comprises the printing on and/or imaging of one- or two-sided thermal media using heat provided by a one- or two-sided thermal printer. Thermal printing may typically be provided in one of two forms: (1) direct thermal printing in which one or more thermally sensitive coatings provided on one or both sides of direct thermal media are thermally imaged, and (2) thermal transfer printing in which one or more thermal transfer receptive coatings provided on one or both sides of thermal transfer media are thermally printed via a functional coating (e.g., dye) transferred from one or more thermal transfer ribbons.

Two-sided direct thermal printing comprises the simultaneous or near simultaneous printing and/or imaging of a first side and a second (opposite) side of two-sided direct thermal print media. Two-sided direct thermal printing of media comprising a document such as a transaction receipt is described in U.S. Pat. Nos. 6,784,906 and 6,759,366 the contents of which are hereby incorporated by reference herein in their entirety. In two-sided direct thermal printing, a two-sided direct thermal printer is configured to allow concurrent printing on both sides of two-sided thermal media moving along a media feed path through the printer. In such printers a thermal print head is disposed on each of two opposite sides of the media for selectively applying heat to one or more thermally sensitive coatings thereon. The coatings change color when heat is applied, by which printing is provided on the respective media sides.

Two-sided thermal transfer printing of media comprising a document such as a voucher or coupon is described in U.S. patent application Ser. Nos. 11/779,732, 11/780,959, 11/834,411, and 11/835,013, the contents of all of which are hereby incorporated by reference herein in their entirety. In two-sided thermal transfer printing, a two-sided thermal transfer printer is configured to allow concurrent printing on both sides of two-sided thermal transfer media moving along a media feed path through the printer. In two-sided thermal transfer printers a thermal print head is disposed on each of two sides of the media for selectively applying heat to one or more thermal transfer ribbons interposed therebetween. One or more functional coatings (e.g., comprising a dye) from the thermal transfer ribbon(s) is transferred to the media when heat is applied, by which printing is provided on the respective media sides.

SUMMARY

Fanfold media comprising a substrate having a first side and a second side, opposite the first side, a first thermally sensitive coating on the first side of the substrate, and a first overcoat covering a portion of the first thermally sensitive coating proximate to a convex portion of one or more fanfolds associated with the fanfold media is provided, wherein the first overcoat mitigates spallation of the first thermally sensitive coating.

Depending on the embodiment, the fanfold media may further comprise a second thermally sensitive coating on the second side of the substrate, and a second overcoat covering a portion of the second thermally sensitive coating proximate to a convex portion of the one or more fanfolds associated with the fanfold media, wherein the second overcoat mitigates spallation of the second thermally sensitive coating.

In addition, the first overcoat may further cover a portion of the first thermally sensitive coating proximate to a concave portion of the one or more fanfolds associated with the fanfold media on the first media side. Likewise, the second overcoat may further cover a portion of the second thermally sensitive coating proximate to a concave portion of the one or more fanfolds associated with the fanfold media on the second media side.

In some embodiments, the fanfold media may further comprise perforations coincident with the one or more fanfolds associated with the fanfold media. Likewise, in other embodiments, the fanfold media may comprise perforations away from and/or interspersed with the one or more fanfolds.

Depending on the embodiment, the first overcoat covering a portion of the first thermally sensitive coating proximate to the convex portion of the one or more fanfolds may comprise a stripe of first overcoat centered on the convex portion of the one or more fanfolds. In some embodiments the stripe may range from approximately 1/32 to 1 inch in width; in others it may range from approximately 1/16 to 1/2 inch in width; in still others it may be approximately 1/8 inch wide.

In some embodiments, the stripe may further comprise a sensemark. In such embodiments, a color of the stripe may be different than a color of the media absent the stripe such as, for example, in the instance where the media is substantially white and the stripe is substantially black.

For direct thermal, thermally sensitive media, the first and/or second overcoats may not prematurely activate or deactivate the respective first and/or second thermally sensitive coatings. Further, the respective first and second overcoats may have sufficiently low thermal resistivity to permit heat applied by a thermal printer to image the first and second thermally sensitive coatings therethrough.

In some embodiments, the first and/or second overcoats do not soften below 150 degrees Celsius. In other embodiments, the first and/or second overcoats do not soften below 100 degrees Celsius.

Further, the first and/or second overcoats may comprise materials having a viscosity in the range of 130 to 230 centipoise at 77 F, a solids content in the range of 33% to 55%, and a pH in the range of 7 to 10 during application thereof to the fanfold media. Alternately or additionally, the first and/or second overcoats may comprise material having a viscosity in the range of 150 to 200 centipoise at 77 F, a solids content in the range of 34% to 40%, and a pH in the range of 9 to 10 during application thereof to the fanfold media. Similarly, the first and/or second overcoats may comprise a material having a viscosity in the range of 165 to 185 centipoise at 77 F, a solids content in the range of 35% to 37%, and a pH in the range of 9.2 to 9.8 during application thereof to the fanfold media.

Finally, the first and/or second overcoats may provide water, scuff and/or UV resistance to the media surface where they are applied.

A method of applying an overcoat to media comprising a substrate and having a first and a second media side, the method comprising: identifying whether the media includes a friable coating on the first and/or the second side thereof, and applying an overcoat to a portion of any identified friable coating included on the respective first and/or second media sides is also provided, wherein the overcoat mitigates spallation of the identified friable coating.

In some embodiments, identifying whether the media includes a friable coating on a first and/or a second side thereof may comprise identifying whether the fanfold media includes a thermally sensitive coating on a first and/or a second side thereof.

Likewise, applying an overcoat to a portion of any identified friable coating included on the respective first and/or second media sides may comprise applying a series of stripes of overcoat to the respective first and/or second media sides, wherein the method further comprises fanfolding the media proximate to the center of each of the series of stripes. Depending on the embodiment, the series of stripes of overcoat on the second media side may be opposite the series of stripes of overcoat on the first media side.

In some embodiments, the method may further comprise identifying a type of substrate utilized in the media, and varying a width of each of the stripes of overcoat, perpendicular to the direction of the one or more fanfolds, with the identified substrate type, which substrate type may comprise one of cellulose, polypropylene, and polyethylene.

Additionally or alternately, the method may further comprise identifying a thickness of substrate utilized in the media, and increasing a width of each of the stripes of overcoat, perpendicular to the direction of the one or more fanfolds, with increased thickness of the substrate.

An apparatus for fanfolding media having a first and a second side, is also provided, the apparatus comprising: a first sensor adapted to identify whether the media includes a friable coating on the first side thereof, and a first print tower adapted to apply an overcoat to a portion of the first media side in response to friable coating being identified thereon by the first sensor. In some embodiments, the apparatus may further comprise a second sensor adapted to identify whether the media includes a friable coating on the second side thereof, and a second print tower adapted to apply an overcoat to a portion of the second media side in response to friable coating being identified thereon by the second sensor.

The first sensor may be adapted to identify whether the media includes a thermally sensitive coating on the first side thereof as the friable coating. Likewise, the second sensor may be adapted to identify whether the media includes a thermally sensitive coating on the second side thereof as the friable coating.

Additionally, the apparatus may further comprise a folding unit adapted to fold the media proximate to the portion of the first media side where the first print tower is adapted to apply the overcoat. The apparatus may also comprise a perforating unit adapted to perforate the media proximate to the portion of the first media side where the first print tower is adapted to apply the overcoat (e.g., near to or coincident with where the folding unit is adapted to fold the media), and/or portions of the media web therebetween.

Further, the first print tower may be adapted to apply a first series of stripes of overcoat to the first media side in response to friable coating being identified thereon by the first sensor, and the folding unit may be adapted to fold the media about the centerline of each of the applied first series of stripes.

Likewise, the second print tower may be adapted to apply a second series of stripes of overcoat to the second media side, interspersed with the first series of stripes, in response to friable coating being identified thereon by the second sensor, and the folding unit may be adapted to fold the media about the centerline of each of the applied second series of stripes in a direction opposite to the fold of the media about the first series of stripes.

Variations are also provided.

DETAILED DESCRIPTION

By way of example, various embodiments of the invention are described in the material to follow with reference to the included drawings. Variations may be adopted.

Figure 1:
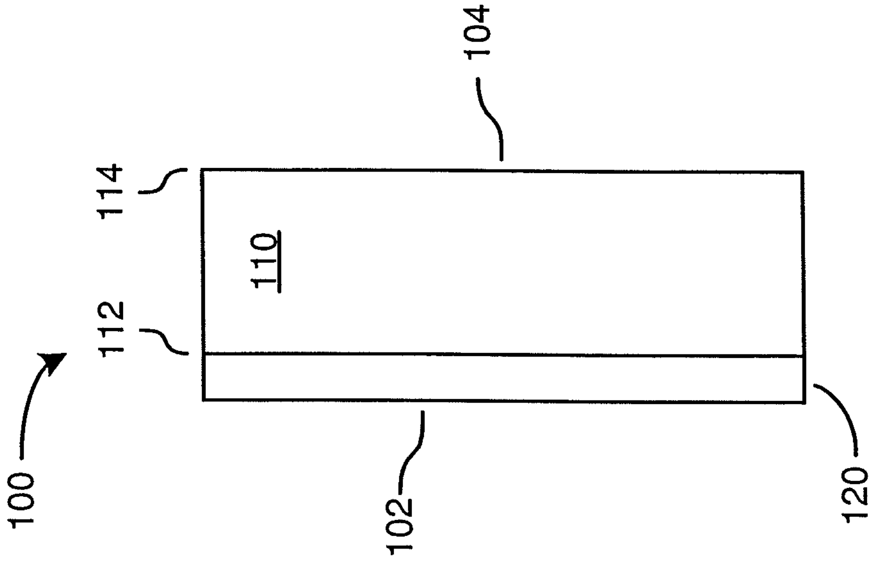
FIG. 1 provides a cross-sectional view of media in the form of one-sided direct thermal paper.

FIG. 1 illustrates a cross-sectional view of one-sided direct thermal media 100 for use as, for example, a transaction receipt, ticket, label, bank statement, pharmacy script, or other document. As shown in FIG. 1, one-sided direct thermal media 100 may have a first and a second side 102, 104. Additionally, one-sided direct thermal media 100 may comprise a substrate 110 having a thermally sensitive coating 120 on a first side 112 thereof. The substrate 110 of one-sided direct thermal media may comprise a fibrous or film type sheet either or both of which may comprise one or more natural (e.g., cellulose, cotton, starch, and the like) and/or synthetic (e.g., polyethylene, polyester, polypropylene, and the like) materials. In one embodiment, the substrate 110 is provided in the form of a non-woven cellulosic (e.g., paper) sheet.

A thermally sensitive coating 120 may comprise at least one dye and/or pigment, and optionally, may include one or more activating agents which undergo a color change upon the application of heat by which printing is provided. In one embodiment, a dye-developing type thermally sensitive coating comprising a leuco-dye (e.g., 3,3-bis(p-dimethylaminophenyl)-phthalide, 3,3-bis(p-dimethylaminophenyl)-6-dimethylaminophthalide, 3-cyclohexylamino-6-chlorofluoran, 3-(N—N-diethylamino)-5-methyl-7-(N,N-Dibenzylamino)fluoran, and the like), a developer (e.g., 4,4'-isopropylene-diphenol, p-tert-butylphenol, 2-4-dinitrophenol, 3,4-dichlorophenol, p-phenylphenol, 4,4-cyclohexylidenediphenol, and the like), and an optional sensitizer (e.g., acetamide, stearic acid amide, linolenic acid amide, lauric acid amide, and the like) as disclosed in U.S. Pat. No. 5,883,043 to Halbrook, Jr., et al. the contents of which are hereby incorporated by reference herein, is provided.

In other embodiments, one-sided direct thermal media 100 may further comprise a sub coat (not shown), a top coat (not shown) and a back coat (not shown). Where provided, a sub coat may be included as a buffer region between a first surface 112 of a substrate 110 and a thermally sensitive coating 120 to avoid adverse interaction of chemicals and/or impurities from the substrate 110 with the thermally sensitive coating 120, and thereby avoid undesired and/or premature imaging. Further, a sub coat may be provided to prepare an associated surface 112 of a substrate 110 for reception of a thermally sensitive coating 120, such as by providing for a desired or required surface finish or smoothness. Suitable sub coats include clay and/or calcium carbonate based coatings. In one embodiment, a clay based sub coat is applied to a first surface of a cellulosic substrate 110 and calendered to a smoothness of greater than approximately 300 Bekk seconds prior to application of an associated thermally sensitive coating 120 comprising one or more leuco dyes, developers and sensitizers.

A top coat may be provided over a thermally sensitive coating 120 to protect the thermally sensitive coating and/or any resultant image from mechanical (e.g., scratch, smudge, smear, and the like) and/or environmental (chemical, UV, and the like) degradation. Likewise, a top coat may be provided to enhance slip between the thermally sensitive coated side 102 of one-sided thermal media 100 and various components of a thermal printer such as, but not limited to a thermal print head. A top coat may include any suitable components that serve to protect or enhance the performance and/or properties of a thermally sensitive layer 120 such as one or more polymers, monomers, UV absorbers, scratch inhibitors, smear inhibitors, slip agents, and the like. In one embodiment, a top coat comprising a zinc stearate is provided over a thermally sensitive coating 120 in the form of a leuco dye/developer system.

One-sided direct thermal media 100 may further comprise a back coat on a second side 114 of a substrate 110 to, inter alia, mitigate against mechanical and/or environmental damage to the substrate 110 and/or thermally sensitive coating 120, as well as provide for desirable mechanical and/or physical properties (e.g., slip, release, tear, adhesive, permeability, water resistance, UV absorbing, smoothness, static, and the like). In one embodiment, a calcium carbonate based back coat is provided for acceptance of ink jet printing thereon.

Figure 2:
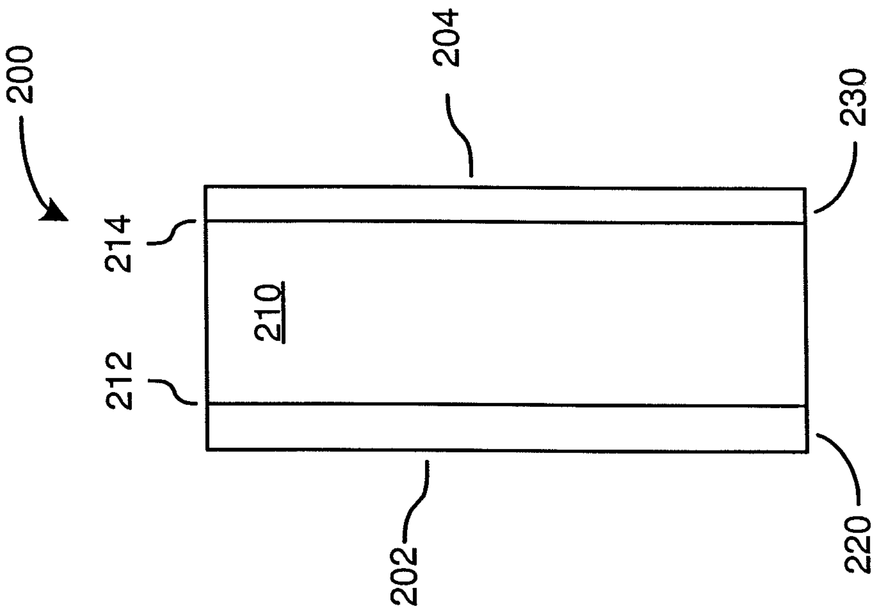
FIG. 2 provides a cross-sectional view of media in the form of two-sided direct thermal paper.

FIG. 2 illustrates a cross-sectional view of two-sided direct thermal media 200 for use as, for example, a transaction receipt, ticket, label, bank statement, pharmacy script, or other document. As shown in FIG. 2, two-sided direct thermal media 200 may comprise a substrate 210 having a first and a second thermally sensitive coating 220, 230 on a first and a second side 212, 214 thereof. As for one-sided direct thermal media 100, the substrate 210 of two-sided direct thermal media 200 may comprise a fibrous or film type sheet either or both of which may comprise one or more natural (e.g., cellulose, cotton, starch, and the like) and/or synthetic (e.g., polyethylene, polyester, polypropylene, and the like) materials. In one embodiment, the substrate 210 is provided in the form of a spunbonded high density polyethylene sheet.

The thermally sensitive coating 220, 230 may comprise at least one dye and/or pigment, and optionally, may include one or more activating agents which undergo a color change upon the application of heat by which printing is provided. In one embodiment, dye-developing type thermally sensitive coatings 220, 230 comprising one or more leuco-dyes, developers, and, optionally, one or more sensitizers, as described hereinabove, are provided.

Two-sided direct thermal media 200 may further comprise a sub coat (not shown) between a first and a second surface 212, 214 of a substrate 210 and a respective first and second thermally sensitive coating 220, 230 in order to, inter alia, avoid adverse interaction of chemicals and/or impurities from the substrate 210 with the thermally sensitive coatings 220, 230. Additionally, one or more sub coats may be provided to prepare an associated surface 212, 214 of a substrate 210 for reception of a respective thermally sensitive coating 220, 230 such as by providing for a desired or required surface finish or smoothness. Suitable sub coats include clay and/or calcium carbonate based coatings. In one embodiment, clay based sub coats are applied to respective first and second surfaces 212, 214 of a spunbonded high density polyethylene substrate 210, and calendered to a smoothness of greater than approximately 300 Bekk seconds prior to application of associated thermally sensitive coatings 220, 230 comprising one or more leuco dyes, developers and sensitizers.

Finally, and as disclosed hereinabove with respect to one-sided direct thermal media 100, two-sided direct thermal media 200 may comprise one or more top coats (not shown) over one or both of the thermally sensitive coatings 220, 230 in order to, interalia, protect the thermally sensitive coating and/or any resultant image from mechanical (e.g., scratch, smudge, smear, and the like) and/or environmental (chemical, UV, and the like) degradation. Likewise, one or more top coats may be provided to enhance slip between a respective side 202, 204 of two-sided thermal media 200 and various components of a thermal printer such as, but not limited to respective thermal print heads. A top coat may include any suitable components that serve to protect or enhance the performance and/or properties of a thermally sensitive layer 220, 230 such as one or more polymers, monomers, UV absorbers, scratch inhibitors, smear inhibitors, slip agents, and the like. In one embodiment, first and second top coats comprising UV absorbers are provided over first and second thermally sensitive coatings 220, 230 in the form of leuco dye/developer systems comprising two-sided direct thermal media 200.

Depending on the application, a first thermally sensitive coating 220 may have a dye and/or co-reactant chemical which activates at a different temperature than the dye and/or co-reactant chemical present in the second coating 230. Alternatively or additionally, a substrate 210 of two-sided direct thermal media 200 may have sufficient thermal resistance to prevent heat applied to one coating 220, 230 from activating the dye and/or co-reactant chemical in the other coating 230, 220, as disclosed in U.S. Pat. No. 6,759,366 to Beckerdite et al. the contents of which are hereby incorporated herein by reference.

Figure 3:
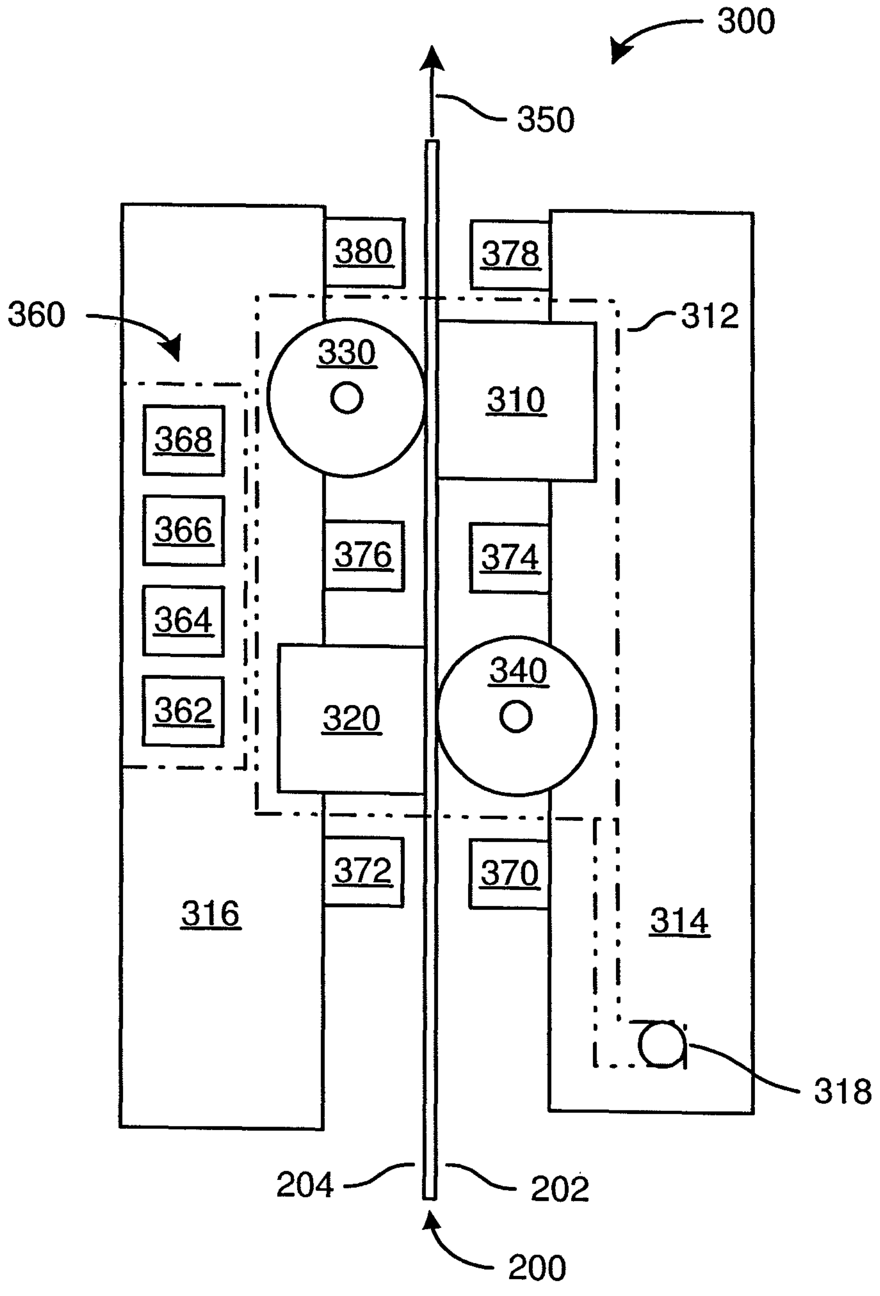
FIG. 3 provides a schematic of a two-sided direct thermal printer.

FIG. 3 illustrates a two-sided direct thermal printer 300 for direct thermal printing of, for example, the one- or two-sided direct thermal media 100, 200 of FIGS. 1 and 2. As shown in FIG. 3, a two-sided direct thermal printer 300 may comprise first and second thermal print heads 310, 320 for printing on respective sides 102, 202, 204 of one- or two-sided media 100, 200 moving along a media feed path 350. Additionally, first and second platens 330, 340 may be provided on opposite sides of the media 100, 200 and feed path 350 thereof proximate to the first and second print heads 310, 320 in order to, for example, maintain contact between the first and second print heads 310, 320 and a respective first and second side 102, 104, 202, 204 of the media 100, 200.

Depending on the printer design and/or application, the media 100, 200 may be supplied in the form of a roll, fanfold stock, individual (cut) sheets, and the like, upon which information in text and/or graphic form may be printed on one or both sides thereof to provide, for example, a voucher, coupon, receipt, ticket, label, statement, script, or other article or document. In one embodiment, a two-sided direct thermal printer 300 comprises first and second thermal print heads 310, 320, and first and second rotating platens 330, 340 to facilitate printing on one or both sides of one- or two-sided direct thermal media 100, 200 provided in fanfold form.

As shown in FIG. 3, a two-sided direct thermal printer 300 may further include a controller 360 for controlling operation of the printer 300. The controller 360 may comprise a communication controller 362, one or more buffers or memory elements 364, a processor 366, and/or a printing function switch 368. The communication controller 362 may provide for receiving and/or sending print commands and/or data to and from a host computer or terminal such as a point-of-sale (POS) terminal (not shown), an automated teller machine (ATM) (not shown), a self-checkout system (not shown), a personal computer (not shown), and the like, associated with the printer 300. The communications controller 362 may provide for input of data to, or output of data from, the printer 300 pursuant to one or more wired (e.g., parallel, serial/USB, Ethernet, etc) and/or wireless (e.g., 802.11, 802.15, IR, etc) communication protocols, among others.

Where provided, the one or more buffers or memory elements 364 may provide for short or long term storage of received print commands and/or data. As such, the one or more buffer or memory elements 364 may comprise one or more volatile (e.g., dynamic or static RAM) and/or non-volatile (e.g., EEPROM, flash memory, etc) memory elements. In one embodiment, a two-sided direct thermal printer 300 includes a first and a second memory element or storage area 364 wherein the first memory element or storage area 364 is adapted to store data identified for printing by one of the first and the second thermal print heads 310, 320, while the second memory element or storage area 364 is adapted to store data identified for printing by the other of the first and the second thermal print heads 310, 320.

In a further embodiment, a two-sided direct thermal printer 300 may additionally include a third memory element or storage area 364 in the form of a received print data storage buffer adapted to store data received by the printer 300 through use of, for example, a communication controller 362 for printing by a first and/or a second thermal print head 310, 320. Data from the received print data storage buffer 364 may, then, be retrieved and processed by a processor 366 associated with the printer 300 in order to, for example, split the received print data into a first data portion for printing on a first side 202 of two-sided direct thermal print media 200 by a first thermal print head 310, and a second data portion for printing on a second side 204 of the two-sided direct thermal print media 200 by a second thermal print head 320. Once a split determination has been made, such first and second data portions may, in turn, be stored in respective first and second memory elements or storage areas 364 in preparation for printing by the respective first and second print heads 310, 320.

As further illustrated in FIG. 3, a two-sided direct thermal printer 300 may additionally include one or more sensors 370, 372, 374, 376, 378, 380 to sense absolute or relative location on one or both sides of one- or two-sided thermal media 100, 200 for printing by a first and/or a second thermal print head 310, 320. Depending on the embodiment, one or more sense marks (e.g., sense marks 450 associated with fanfold media 400 of FIG. 4A and sense marks 750 associated with fanfold media 700 of FIG. 7A) may be provided on one or both sides of installed one- or two-sided thermal media 100, 200 for indication of absolute and/or relative location by included sensors 370, 372, 374, 376, 378, 380. In alternate embodiments, one or more mechanical and/or optical sensors 370, 372, 374, 376, 378, 380 may be used to directly detect a physical attribute of installed print media such as location of a fanfold (e.g., a line, a crease, and/or a convex and/or concave surface), a coating (e.g., an overcoat 560, 570, 660, 670, 760, 770, 824, 844, 924, 944, and in particular a colored or tinted overcoat), a perforation/hole, and the like, and thereby control printing by a first and a second print head 310, 320 directly with respect thereto.

In further reference to FIG. 3, a two-sided direct thermal printer 300 may also include first and second support arms 314, 316. The first support arm 314 may further be journaled on an arm shaft 318 to permit it to pivot or rotate in relation to the second support arm 316 in order to, for example, facilitate access to, and servicing of, the two-sided direct thermal printer 300, including loading of one- or two-sided direct thermal media 100, 200 therein. In alternate embodiments, the first and second support arms 314, 316 may be in a fixed relation to one another.

A two-sided direct thermal printer 300 may further include a drive system 312 for transporting media, such as one- or two-sided thermal media 100, 200, through the printer 300 during a print process. A drive system 312 may comprise one or more motors (e.g. stepper, servo, and the like) (not shown) for powering a system of gears, links, cams, belts, wheels, pulleys, rollers, combinations thereof, and the like. In one embodiment, a drive system 312 comprising a stepper motor and one or more gears adapted to rotate one or both of a first and a second platen 330, 340 each provided in the form of a circular cylinder is provided to transport media 100, 200 through the two-sided direct thermal printer 300. In alternate embodiments, a drive system 312 comprising a stepper motor operatively connected to one or more dedicated drive (e.g., non-platen) rollers (not shown) may be provided.

Figure 4A:
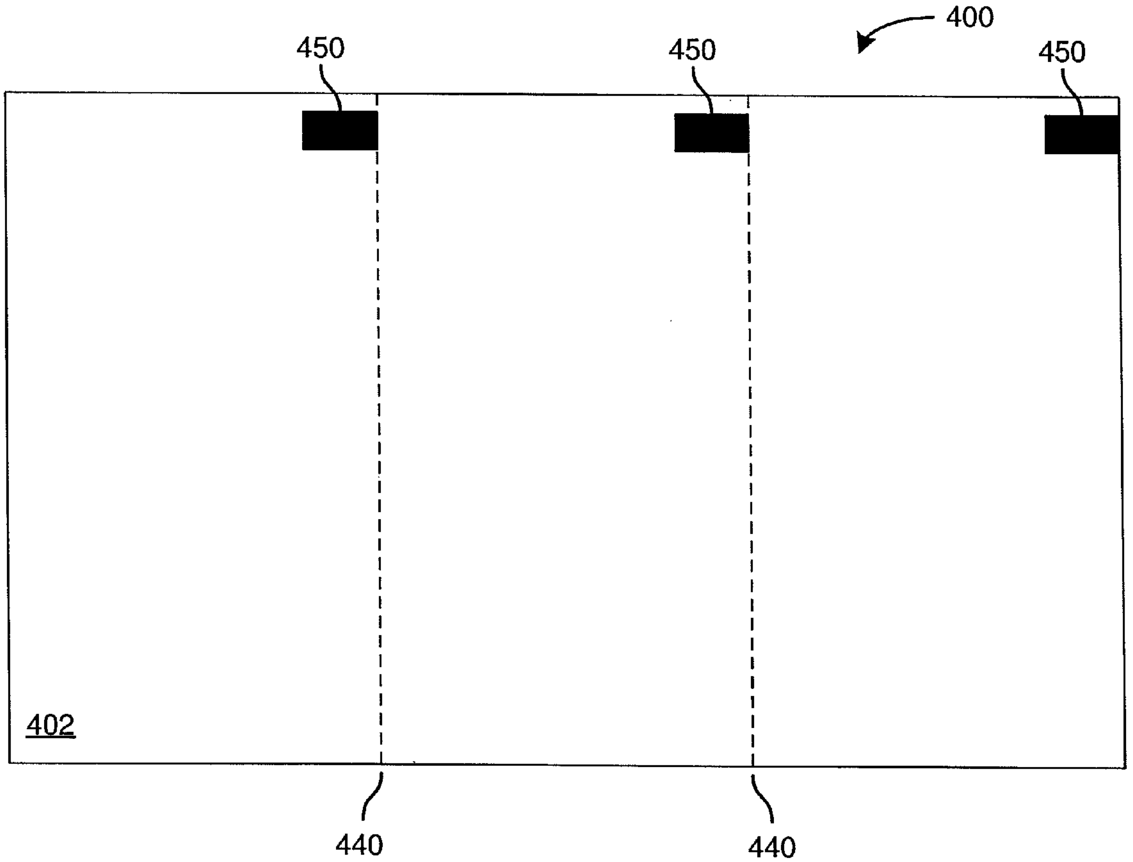
FIG. 4A provides a top view of fanfold media according to a first embodiment.
Figure 4B:
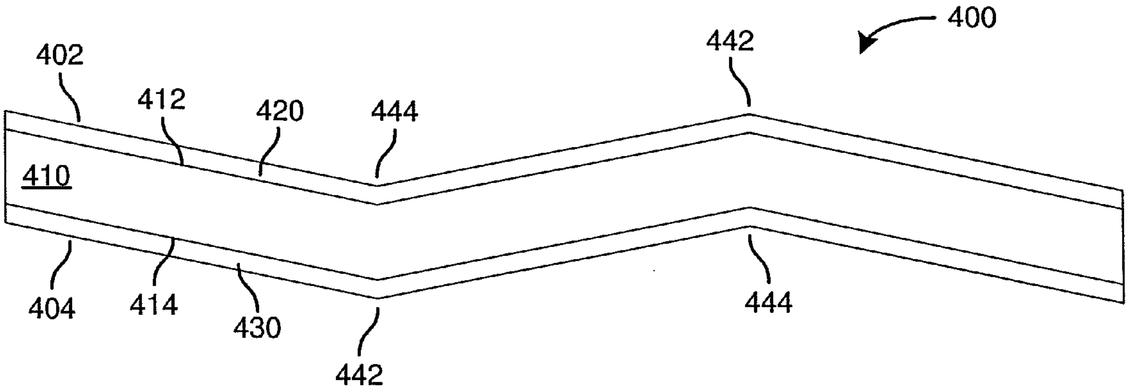
FIG. 4B provides a cross-sectional view of fanfold media according to a first embodiment.

FIG. 4A provides a top view, and FIG. 4B provides a cross-sectional view, of fanfold media 400 according to a first embodiment. As shown in FIG. 4B fanfold media 400 may comprise a substrate 410 having a first and a second thermally sensitive coating 420, 430 on each of a first and a second side 412, 414 thereof. As for the one-sided or two-sided direct thermal media 100, 200 discussed hereinabove with respect to FIGS. 1 and 2, the substrate 410 of the fanfold media 400 may comprise a fibrous or film type sheet either or both of which may comprise one or more natural (e.g., cellulose, cotton, starch, and the like) and/or synthetic (e.g., polyethylene, polyester, polypropylene, and the like) materials. In one embodiment, the substrate 410 is provided in the form of a cellulosic sheet.

The thermally sensitive coating 420, 430 may comprise at least one dye and/or pigment, and optionally, may include one or more activating agents which undergo a color change upon the application of heat by which printing is provided. In one embodiment, dye-developing type thermally sensitive coatings 420, 430 comprising one or more leuco-dyes, developers, and, optionally, one or more sensitizers, as described hereinabove, are provided.

It should be understood that fanfold media 400 may be provided with a thermally sensitive coating 420, 430 on only a single side 402, 404 thereof.

As shown in FIGS. 4A and 4B, fanfold media 400 further comprises one or more fanfolds 440 at select (typically uniform) locations along the length of the web of media 400. The fanfolds 440, which may further comprise perforations along some or all of the length thereof (as illustrated), create alternating convex (e.g., ridge) and concave (e.g., valley) portions 442, 444 on the first and second sides 402, 404 of the media 400. It should be noted that in additional embodiments, fanfold media 400 may further comprise one or more perforations located away from and/or interspersed with (e.g., not co-located or coincident with) the one or more fanfolds 440.

Formation of the convex and concave portions (e.g., ridges and valleys) 442, 444 may locally fracture the thermal coatings 420, 430, and/or any associated sub or top coatings, leading to the chipping, fragmenting, and/or flaking (e.g., spalling) of portions of such coatings proximate to the fanfolds 440. Such chipped, fragmented and/or flaked coatings 420, 430 may deposit in or on media handling equipment such as, but not limited to, printing surfaces (e.g., print heads 310, 320 and/or platens 330, 340) associated with a thermal printer, ultimately degrading print performance.

Figure 5A:
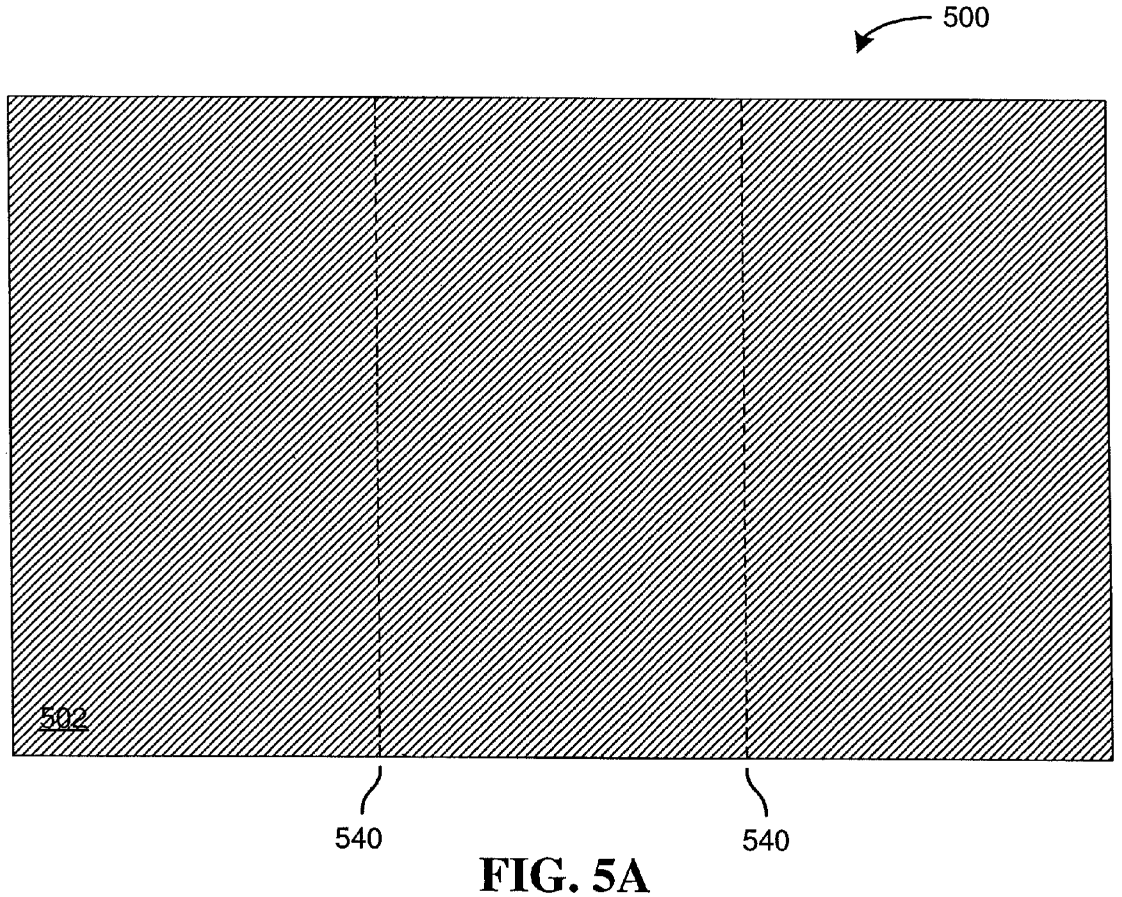
FIG. 5A provides a top view of fanfold media according to a second embodiment.
Figure 5B:
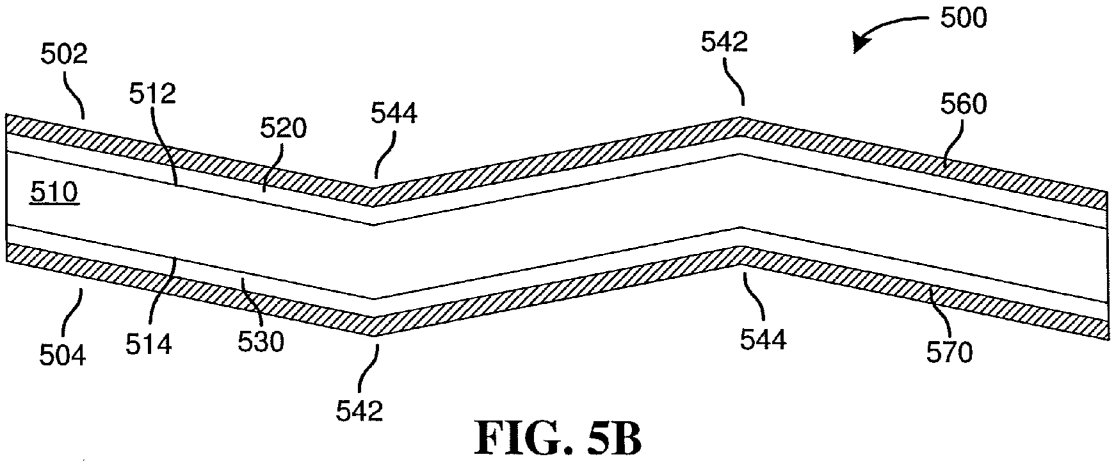
FIG. 5B provides a cross-sectional view of fanfold media according to a second embodiment.

FIG. 5A provides a top view, and FIG. 5B provides a cross-sectional view, of fanfold media 500 according to a second embodiment. As shown in FIG. 5B fanfold media 500 may comprise a substrate 510 having a first and a second thermally sensitive coating 520, 530 on each of a first and a second side 512, 514 thereof. As for the one-sided or two-sided direct thermal media 100, 200 discussed hereinabove with respect to FIGS. 1 and 2, the substrate 510 of the fanfold media 500 may comprise a fibrous or film type sheet either or both of which may comprise one or more natural (e.g., cellulose, cotton, starch, and the like) and/or synthetic (e.g., polyethylene, polyester, polypropylene, and the like) materials. In one embodiment, the substrate 510 is provided in the form of a spunbonded high density polyethylene sheet.

The thermally sensitive coating 520, 530 may comprise at least one dye and/or pigment, and optionally, may include one or more activating agents which undergo a color change upon the application of heat by which printing is provided. In one embodiment, dye-developing type thermally sensitive coatings 520, 530 comprising one or more leuco-dyes, developers, and, optionally, one or more sensitizers, as described hereinabove, are provided.

As for the fanfold media 400 illustrated in FIGS. 4A and 4B, it should be understood that fanfold media 500 may be provided with a thermally sensitive coating 520, 530 on only a single side 502, 504 thereof. Additionally, as described with respect to the one- and two-sided thermal media 100, 200 of FIGS. 1 and 2, the fanfold media 500 of FIGS. 5A and 5B may further include one or more sub coatings between a particular substrate side 512, 514 and a respective thermally sensitive coating 520, 530, and/or one or more conventional top coatings on top of a particular thermally sensitive coating 520, 530.

As shown in FIGS. 5A and 5B, fanfold media 500 further comprises one or more fanfolds 540 at select (typically uniform) locations along the length of the web of media. The fanfolds 540, which may further comprise perforations along some or all of an individual location thereof (as illustrated), create alternating convex (e.g., ridge) and concave (e.g., valley) portions 542, 544 on the first and second sides 502, 504 of the media 500. It should be noted that in additional embodiments, fanfold media 500 may further comprise one or more perforations located away from and/or interspersed with (e.g., not co-located or coincident with) the one or more fanfolds 540.

As disclosed hereinabove, creation of such fanfolds, and/or perforations, 540 may locally fracture thermally sensitive and/or other provided friable coatings 520, 530, resulting in unwanted debris generation and subsequent deposit thereof in media handling and/or use equipment, such as, but not limited to, a two-sided direct thermal printer 300. As such, fanfold media 500 of FIGS. 5A and 5B additionally comprises overcoats 560, 570 to mitigate debris generation and deposit from, interalia, the one or more provided thermally sensitive coatings 520, 530. In the embodiment of FIGS. 5A and 5B, the overcoats 560, 570 are provided in the form of flood coats covering the entire top and bottom surfaces 502, 504 of the fanfold media 500, including both of the convex and concave 542, 544 portions of a given fanfold 540, and any provided perforations. It should be noted that only one overcoat 560, 570 may be provided in embodiments where only a single surface 512, 514 of the substrate 510 includes a thermally sensitive or other friable coating or coatings 520, 530.

Unlike conventional top coats, an overcoat 560, 570 comprises one or more materials suitable for maintaining the integrity of a friable coating, such as either of the first and second thermally sensitive coatings 520, 530 of FIG. 5B, and/or any like provided sub or top coatings (not shown), during and subsequent to application of mechanical stress thereto through, for example, the process of fanfolding and/or perforating of the media 500. Suitable overcoats 560, 570 may also need to be compatible with the subject media, including any sub, thermally sensitive, top or other coatings provided thereon, and/or desired or required print means (e.g., direct thermal, thermal transfer, inkjet, laser, and the like).

In the case of direct thermal printers 300 and media 100, 200, 400, 500, it may be required or desired that an overcoat 560, 570 be compatible with provided thermally sensitive coatings 120, 220, 230, 420, 430, 520, 530 such that, for example, the overcoat material does not prematurely activate or deactivate the thermally sensitive coating or coatings during application, or subsequent thereto. Likewise, a suitable overcoat 560, 570 may further be required to have sufficient heat transfer characteristics (e.g., sufficiently low thermal resistivity) after application (e.g., after dry or cure) thereof such that heat applied by one or more thermal print heads 310, 320 thereto will image or otherwise cause printing to occur in any thermally sensitive coatings 120, 220, 230, 420, 430, 520, 530 over which the overcoat 560, 570 has been applied.

Additionally, suitable overcoats 560, 570 for direct thermal media use may preferably have a softening temperature after application (e.g., post-dry or cure) above the normal operating temperature range of direct thermal printers (e.g., 50≤T-operating≤150 C). In one embodiment, suitable overcoat materials 560, 570, after application (e.g., post-dry or cure) thereof, have softening temperatures greater than 150 C. In another embodiment, suitable overcoat materials 560, 570, after application (e.g., post-dry or cure) thereof, have softening temperatures greater than 100 C.

In addition, suitable materials for application (e.g., pre-dry or cure) as an overcoat 560, 570 may generally have a viscosity in the range of 130 to 230 centipoise at 77 F; preferably 150 to 200 centipoise at 77 F; more preferably 165 to 185 centipoise at 77 F. In one embodiment, a suitable material for application (e.g., pre-dry or cure) as an overcoat 560, 570 has a viscosity of approximately 175 centipoise at 77 F.

Likewise, suitable materials for application (e.g., pre-dry or cure) as an overcoat 560, 570 are preferably water based, having a solids content in the range of 33% to 55%; preferably 34% to 40%; more preferably 35% to 37%. In one embodiment, a suitable material for application (e.g., pre-dry or cure) as an overcoat 560, 570 has a solids content of approximately 36%.

Further, suitable materials for application (e.g., pre-dry or cure) as an overcoat 560, 570 typically have a pH in the range of 7 to 10; preferably 9 to 10; more preferably 9.2 to 9.8.

Finally, suitable overcoat materials may be selected to provide a range of additional properties and characteristics including, but not limited to, providing water, scuff, UV, and the like resistance, as well as providing for a desired or required surface finish (e.g., gloss, semi-gloss or, preferably, matte) after application (e.g., post-dry or cure) thereof.

In an alternate embodiment, a suitable material for application as an overcoat (e.g., pre-dry or cure) may be provided in the form of a UV curable liquid having a solids content of approximately 100%, a viscosity of approximately 800 to 1200 centipoise at 77 F, and a pH in the range of 6.5 to 7.5; more preferably 7.

In one embodiment, a flood coat of a transparent white, water based ink sold under the Versilam Plus name (part no. UVB011237) by Water Ink Technologies, Inc. of Lincolnton, N.C. may be applied over one or both thermally sensitive coatings 520, 530 and dried to form a respective overcoat 560, 570 of the fanfold media 500. In an alternate embodiment, a flood coat of an approximately 100% solids, UV cured ink sold under the Nuvaflex 30 Series name (part nos. 3095 or 3096) by Zeller+Gmelin Corporation of Richmond, Va. may be applied over one or both thermally sensitive coatings 520, 530 and UV cured to form a respective overcoat 560, 570 of the fanfold media 500. It should be noted that either or both of the above described overcoat materials may further be applied consistent with the methodologies discussed with respect to FIGS. 6A and 6B, and 7A and 7B hereinbelow.

Typically an applied overcoat 560, 570 may be transparent or semi-transparent to permit print to be visible thereon and/or therethrough. However, in some embodiments, an applied overcoat 560, 570 may comprise one or more pigments or dyes for controlling a color thereof in order to enhance or otherwise augment media 500 use. For example, in one embodiment, an overcoat 560, 570 may comprise a light colored (e.g., white, yellow, and the like) material thereby providing a contrasting background against which darker (e.g., black, blue, red, green, and the like) press or other print (e.g., thermal transfer, inkjet, laser and the like) may be viewed. Likewise, in some embodiments, an overcoat 560, 570 may comprise a dark colored (e.g., black, blue, red, green and the like) material which may also be used to provide a contrasting background against which light (e.g., white, yellow, and the like) print may be viewed.

Alternately or additionally, in some embodiments, a dark colored (e.g., black, blue, red, green, and the like) overcoat 560, 570 may be selectively applied to both mitigate debris formation from (e.g., spallation of) one or more friable coatings, such as either or both of the thermally sensitive coatings 520, 530 of FIGS. 5A and 5B, and act as a sensemark to indicate location of the one or more fanfolds, and/or perforations, 540 associated with the media 500 for identification of location for subsequent printing, imaging and/or cutting thereof. Such use may, by corollary, be applied to the embodiments described hereinbelow with respect to FIGS. 6A, 6B, 7A and 7B, wherein some (e.g., alternate) or all of the one or more stripes of overcoat 660, 670, 760, 770 may comprise a pigment or dye for use of such stripe or stripes as a sensemark.

Figure 6A:
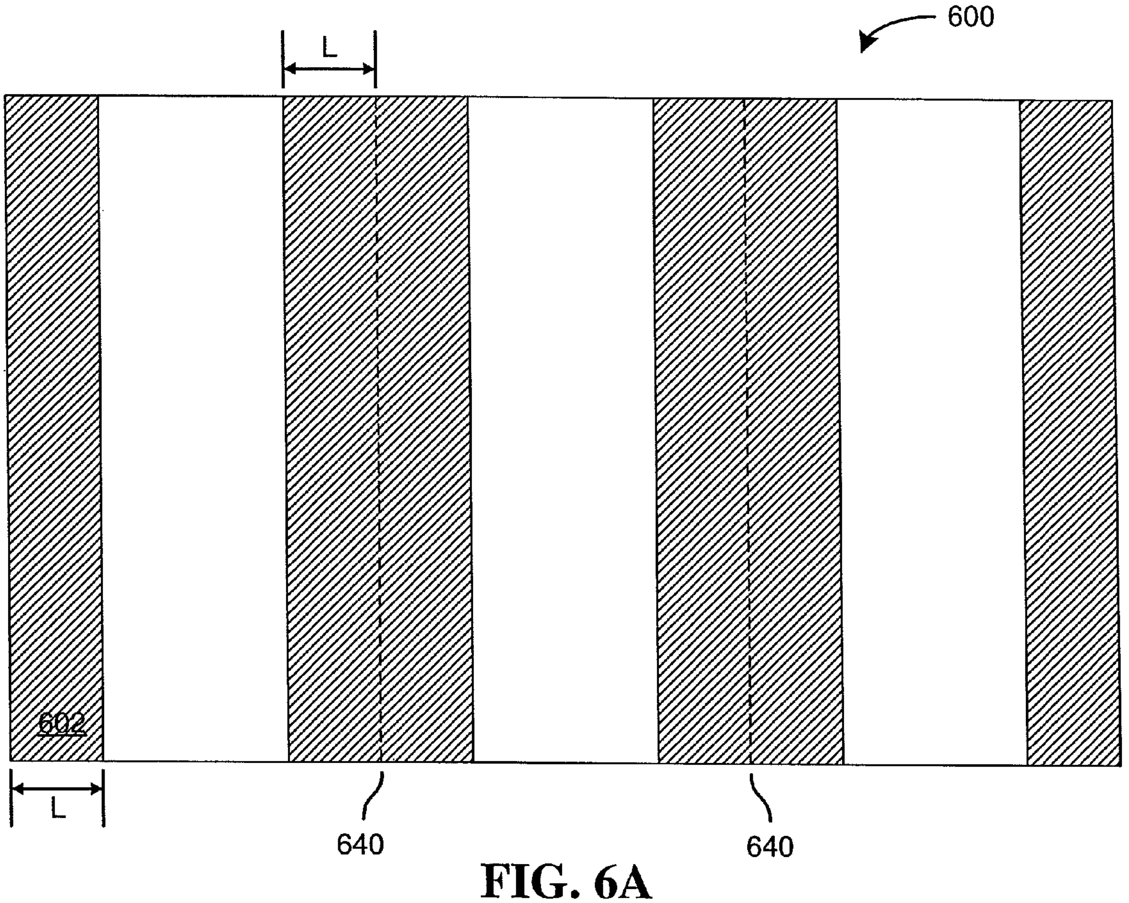
FIG. 6A provides a top view of fanfold media according to a third embodiment.
Figure 6B:
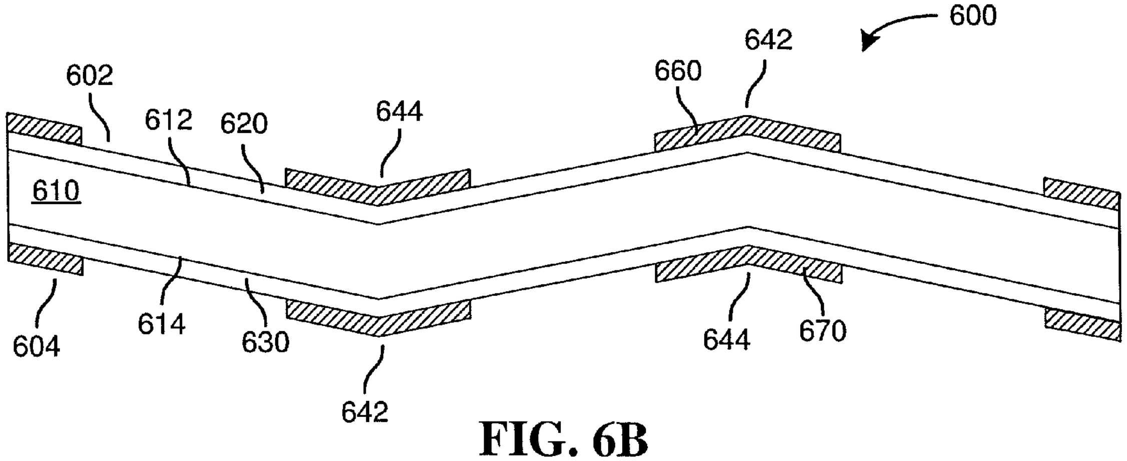
FIG. 6B provides a cross-sectional view of fanfold media according to a third embodiment.

FIG. 6A provides a top view, and FIG. 6B provides a cross-sectional view, of fanfold media 600 according to a third embodiment. As shown in FIG. 6B fanfold media 600 may comprise a substrate 610 having a first and a second thermally sensitive coating 620, 630 on each of a first and a second side 612, 614 thereof. As for the one-sided or two-sided direct thermal media 100, 200 discussed hereinabove with respect to FIGS. 1 and 2, the substrate 610 of the fanfold media 600 may comprise a fibrous or film type sheet either or both of which may comprise one or more natural (e.g., cellulose, cotton, starch, and the like) and/or synthetic (e.g., polyethylene, polyester, polypropylene, and the like) materials. In one embodiment, the substrate 610 is provided in the form of a polyester, or polyester based, sheet.

The thermally sensitive coating 620, 630 may comprise at least one dye and/or pigment, and optionally, may include one or more activating agents which undergo a color change upon the application of heat by which printing is provided. In one embodiment, dye-developing type thermally sensitive coatings 620, 630 comprising one or more leuco-dyes, developers, and, optionally, one or more sensitizers, as described hereinabove, are provided.

As for the fanfold media 400 and 500 described with respect to FIGS. 4A and 4B, and 5A and 5B, it should be understood that fanfold media 600 may be provided with a thermally sensitive coating 620, 630 on only a single side 602, 604 thereof. Additionally, as described with respect to the one- and two-sided thermal media 100, 200 of FIGS. 1 and 2, the fanfold media 600 of FIGS. 6A and 6B may further include one or more sub coatings between a particular substrate side 612, 614 and a respective thermally sensitive coating 620, 630, and/or one or more conventional top coatings on top of a particular thermally sensitive coating 620, 630.

As shown in FIGS. 6A and 6B, fanfold media 600 further comprises one or more fanfolds 640 at select (typically uniform) locations along the length of the web of media. The fanfolds 640, which may further comprise perforations along some or all of an individual location thereof (as illustrated), create alternating convex (e.g., ridge) and concave (e.g., valley) portions 642, 644 on the first and second sides 602, 604 of the media 600. It should be noted that in additional embodiments, fanfold media 600 may further comprise one or more perforations located away from and/or interspersed with (e.g., not co-located or coincident with) the one or more fanfolds 640.

As disclosed hereinabove, creation of such fanfolds, and/or perforations, 640 may locally fracture the thermally sensitive and/or other provided friable coatings 620, 630, resulting in unwanted debris generation and subsequent deposit thereof in media handling and/or use equipment, such as, but not limited to, a two-sided direct thermal printer 300. As such, the fanfold media 600 of FIGS. 6A and 6B additionally comprises overcoat 660, 670 to mitigate debris generation and deposit issues from, interalia, fracture of one or more provided thermally sensitive coatings 620, 630 in the fanfold and/or perforating process. In the embodiment of FIGS. 6A and 6B, overcoat 660, 670 is provided in the form of a spot or stripe coat covering a portion of the top and bottom surfaces 602, 604 of the fanfold media 600 proximate to the convex and concave 642, 644 portions of a given fanfold 640. It should be noted that only one overcoat 660, 670 may be provided in embodiments where only a single surface 612, 614 of the substrate 610 includes a thermally sensitive or other friable coating or coatings 620, 630.

Unlike conventional top coats, an overcoat 660, 670 comprises one or more materials suitable for maintaining the integrity of a friable coating, such as either of the first and second thermally sensitive coatings 620, 630 of FIG. 6B, and/or any like provided sub or top coatings (not shown), during and subsequent to application of mechanical stress through, for example, the process of fanfolding and/or perforating of the media 600.

As disclosed hereinabove, suitable overcoats 660, 670 may also need to be compatible with the subject media 600, including any sub, thermally sensitive, top or other coatings provided thereon, and/or any desired or required print means (e.g., direct thermal, thermal transfer, inkjet, laser, and the like), while mitigating unwanted debris generation and deposit issues. For example, in the case of direct thermal media, a suitable overcoat 660, 670 may be one which does not cause premature imaging and/or deactivation of the one or more provided thermally sensitive coatings 620, 630 while permitting heat transfer for direct thermal printing to occur therethrough. Likewise, in the case of inkjet, thermal transfer, laser, and/or like print means receptive media, a suitable overcoat 660, 670 may be one which permits inkjet, thermal transfer, laser, and/or like printing thereon. Suitable overcoats may include materials having properties as described hereinabove with respect to FIGS. 5A and 5B, including material(s) described with respect to any specifically disclosed embodiments.

In the embodiment of FIGS. 6A and 6B, the overcoats 660, 670 each traverse the width of the media 600, in a direction parallel to the fanfolds 640, while traversing a finite length, L, along the length of the media 600 in a direction perpendicular to and away from each fanfold 640, thereby creating a stripe or band of overcoat 660, 670 having a length of 2 L centered on each fanfold 640 on each side 602, 604 of the media 600. Such methodology strategically places overcoat 660, 670 proximate to each fanfold 640, surrounding respective convex and concave (e.g., ridge and valley) portions 642, 644 thereof, corresponding to regions of high mechanical stress during the fanfold and/or perforation process, in order to mitigate the incidence of chipping, fragmenting and/or flaking (e.g., spalling) of any associated friable coating, such as thermally sensitive coating 620, 630, while reducing the overall amount of overcoat 660, 670 utilized. Further, confining the overcoat 660, 670 to regions of the front and back surfaces 602, 604 proximate to the fanfolds 640 reduces adverse impacts associated with the use of some overcoat materials such as, but not limited to, changes in clarity and/or color of print (thermal or otherwise) viewed therethrough, decreased responsivity for thermal printing therethrough due to, for example, an increase in thermal resistance and/or heat capacity by virtue of the use of an overcoat 660, 670, and the like.

Depending on the embodiment, the length, L, of overcoat surrounding each side of a given fanfold may vary from approximately 1/64 to 1/2 inch; preferably 1/32 to 1/4 inch; more preferably 1/16 inch. Further, the length, L, of overcoat may vary with the application process being, for example, smaller for lithographic application processes and longer for flexographic processes, among other viable processes. Likewise, the length, L, may vary with a characteristic of the media 600 including, but not limited to, a substrate type and a media thickness. For example, a length, L, of overcoat may be smaller for a polymeric substrate (e.g., biaxially oriented polypropylene, BOPP) and larger for a cellulosic substrate (e.g., paper). Similarly, the length, L, may increase with media thickness, t, being larger for thicker media 600 and/or substrates 610, and smaller for thinner media 600 and/or substrates 610.

In one embodiment, a stripe of overcoat 660, 670 approximately 1/2 inch in overall length (re. $L \approx 1/4$ inch) is provided, which stripe is centered about each of the one or more fanfolds 640 on each side of media 600 comprising a substrate 610 having thermally sensitive coatings 620, 630 on both sides thereof. In another embodiment, a stripe of overcoat 660 approximately 1/2 inch in overall length (re. $L \approx 1/4$ inch) is provided, which stripe is centered about each of the one or more fanfolds 640 on a single side of media 600 comprising a substrate 610 having thermally sensitive coating 620 on the single side thereof.

It should be noted that in embodiments where only perforations are provided, or where separate perforations are provided which are not coincident with a fanfold 640, a spot or stripe of overcoat may be provided proximate to the perforations on a media 600 side having a friable coating 620, 630 to mitigate debris generation therefrom.

Figure 7A:
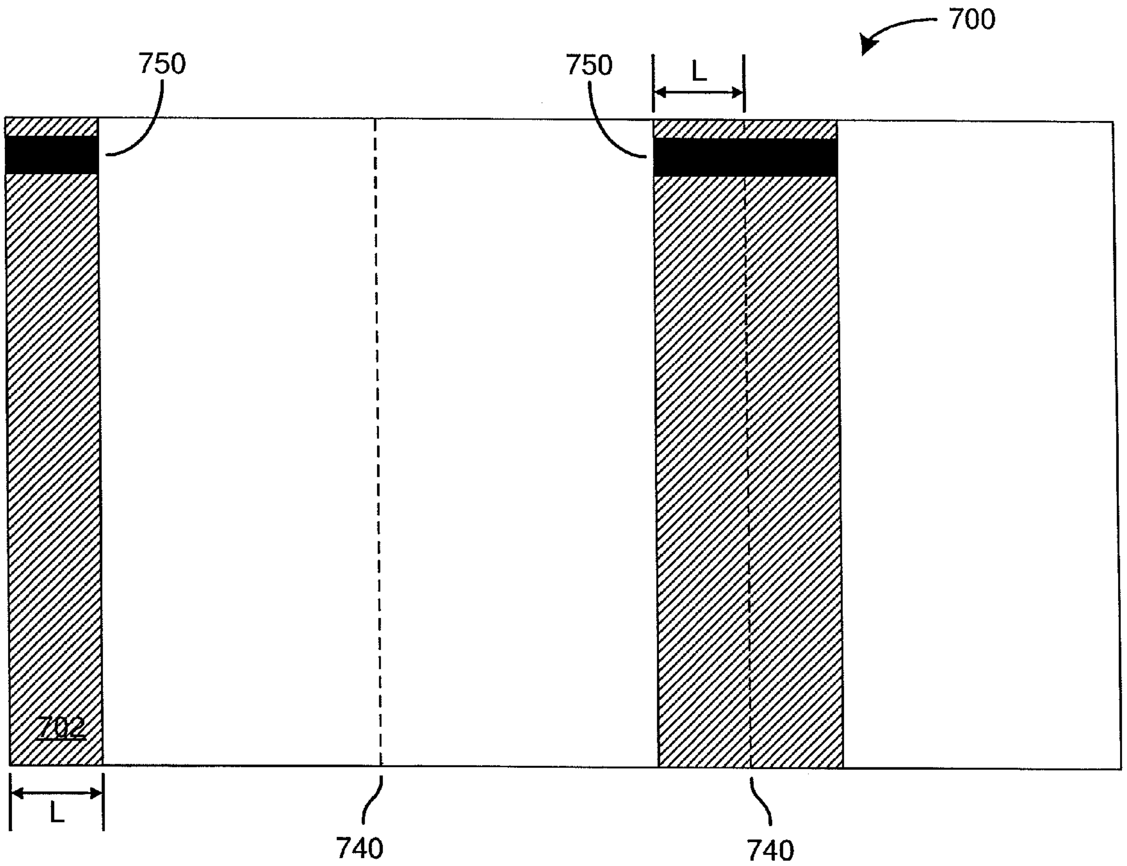
FIG. 7A provides a top view of fanfold media according to a fourth embodiment.
Figure 7B:
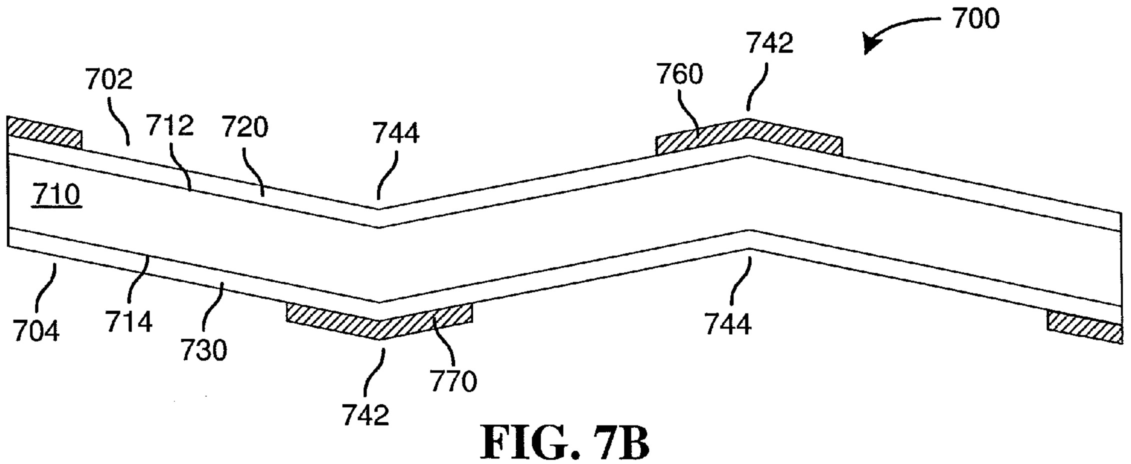
FIG. 7B provides a cross-sectional view of fanfold media according to a fourth embodiment.

FIG. 7A provides a top view, and FIG. 7B provides a cross-sectional view, of fanfold media 700 according to a fourth embodiment. As shown in FIG. 7B fanfold media 700 may comprise a substrate 710 having a first and a second thermally sensitive coating 720, 730 on each of a first and a second side 712, 714 thereof. As for the one-sided or two-sided direct thermal media 100, 200 discussed hereinabove with respect to FIGS. 1 and 2, the substrate 710 of the fanfold media 700 may comprise a fibrous or film type sheet either or both of which may comprise one or more natural (e.g., cellulose, cotton, starch, and the like) and/or synthetic (e.g., polyethylene, polyester, polypropylene, and the like) materials. In one embodiment, the substrate 710 is provided in the form of a polypropylene sheet.

The thermally sensitive coating 720, 730 may comprise at least one dye and/or pigment, and optionally, may include one or more activating agents which undergo a color change upon the application of heat by which printing is provided. In one embodiment, dye-developing type thermally sensitive coatings 720, 730 comprising one or more leuco-dyes, developers, and, optionally, one or more sensitizers, as described hereinabove, are provided.

As for the fanfold media 400, 500 and 600 described with respect to FIGS. 4A and 4B, 5A and 5B, and 6A and 6B, it should be understood that fanfold media 700 may be provided with a thermally sensitive coating 720, 730 on only a single side 702, 704 thereof. Additionally, as described with respect to the one- and two-sided thermal media 100, 200 of FIGS. 1 and 2, the fanfold media 700 of FIGS. 7A and 7B may further include one or more sub coatings between a particular substrate side 712, 714 and a respective thermally sensitive coating 720, 730, and/or one or more conventional top coatings on top of a particular thermally sensitive coating 720, 730.

As shown in FIGS. 7A and 7B, fanfold media 700 further comprises one or more fanfolds 740 at select (typically uniform) locations along the length of the web of media. The fanfolds 740, which may further comprise perforations along some or all of an individual location thereof (as illustrated), create alternating convex (e.g., ridge) and concave (e.g., valley) portions 742, 744 on the first and second sides 702, 704 of the media 700. It should be noted that in additional embodiments, fanfold media 700 may further comprise one or more perforations located away from and/or interspersed with (e.g., not co-located or coincident with) the one or more fanfolds 740.

As disclosed hereinabove, creation of such fanfolds, and/or perforations, 740 may locally fracture the thermally sensitive and/or other provided friable coatings 720, 730, resulting in unwanted debris generation and subsequent deposit thereof in media handling and/or use equipment, such as, but not limited to, a two-sided direct thermal printer 300. As such, the fanfold media 700 of FIGS. 7A and 7B additionally comprises overcoat 760, 770 to mitigate debris generation and deposit issues from, interalia, fracture of one or more provided thermally sensitive coatings 720, 730 in the fanfold and/or perforating process. In the embodiment of FIGS. 7A and 7B, overcoat 760, 770 is provided in the form of a spot or stripe coat covering a portion of the top and bottom surfaces 702, 704 of the fanfold media 700 proximate to the convex (e.g., ridge) portions 742 of each of fanfold 740.

It should be noted that only one overcoat 760, 770 may be provided in embodiments where only a single surface 712, 714 of the substrate 710 includes a thermally sensitive or other friable coating or coatings 720, 730 and, consistent with the embodiment of FIGS. 7A and 7B, such overcoat 760, 770 may only be provided proximate to convex (e.g., ridge) portions 742 of each fanfold on the single thermally coated side. Likewise, in embodiments where only perforations are provided, or where separate perforations are provided which are not coincident with a fanfold 740, a spot or stripe of overcoat may additionally or alternately be provided proximate to the perforations on a media 700 side having a friable coating 720, 730 to mitigate debris generation therefrom.

Unlike conventional top coats, an overcoat 760, 770 comprises one or more materials suitable for maintaining the integrity of a friable coating, such as either of the first and second thermally sensitive coatings 720, 730 of FIG. 7B, and/or any like provided sub or top coatings (not shown), during and subsequent to application of mechanical stress through, for example, the process of fanfolding and/or perforating of the media 700.

As disclosed hereinabove, suitable overcoats 760, 770 may also need to be compatible with the subject media 700, including any sub, thermally sensitive, top or other coatings provided thereon, and/or any desired or required print means (e.g., direct thermal, thermal transfer, inkjet, laser, and the like), while mitigating unwanted debris generation and deposit issues. For example, in the case of direct thermal media, a suitable overcoat 760, 770 may be one which does not cause premature imaging and/or deactivation of the one or more provided thermally sensitive coatings 720, 730 while permitting heat transfer for direct thermal printing to occur therethrough. Likewise, in the case of inkjet, thermal transfer, laser, and/or like print means receptive media, a suitable overcoat 760, 770 may be one which permits inkjet, thermal transfer, laser, and/or like printing thereon. Suitable overcoats include materials having properties as described hereinabove with respect to FIGS. 5A and 5B, including material(s) described with respect to any specifically disclosed embodiments.

In the embodiment of FIGS. 7A and 7B, overcoat 760, 770 traverses the width of the media 700 in a direction parallel to the fanfolds 740, while traversing a finite length, L, in a direction perpendicular to and away from each fanfold 740 on a convex (e.g., ridge) portion 742 thereof, thereby creating a stripe or band of overcoat 760, 770 having a width of 2 L centered on each fanfold 740 on a respective convex (e.g., ridge) portion 742 associated with the media 700, while leaving respective concave (e.g., valley) portions 744 uncoated. Such methodology builds on the methodology illustrated with respect to FIGS. 6A and 6B by strategically placing overcoat 760, 770 proximate to a respective convex (e.g., ridge) portion 742 of each fanfold 740, corresponding to regions of high mechanical tensile stress in order to mitigate the incidence of chipped, fragmented and/or flaked coatings 720, 730, while further reducing the overall amount of overcoat 760, 770 utilized. Additionally, confining overcoat 760, 770 to the convex portion 742 of the fanfolds 740 further reduces potentially adverse impacts associated with use of some overcoat materials such as, but not limited to, changes in clarity and/or color of print (thermal or otherwise) viewed thereon or therethrough, changes (e.g., increases) in thermal resistance and/or heat capacity which may affect (e.g., decrease) heat transfer therethrough and, as a result, direct thermal printing of one or more provided thermally sensitive coatings 720, 730, and the like. By corollary, such selective overcoat strategy also further increases the uncoated area for unaffected reception of desired print via means such as, but not limited to, direct thermal, thermal transfer, inkjet, laser, and the like.

Figure 8:
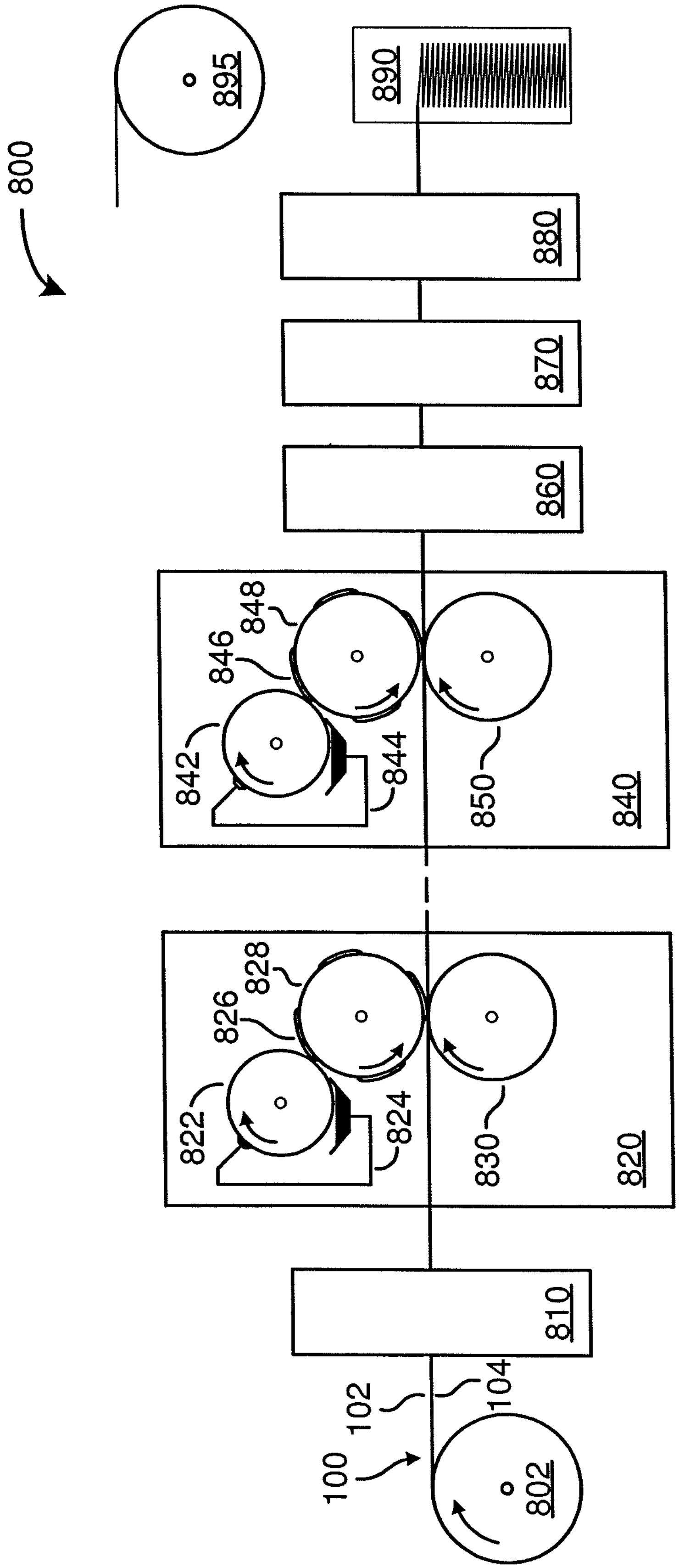
FIG. 8 provides a schematic of a first apparatus for making fanfold media.

FIG. 8 provides a schematic of a first apparatus 800 for making fanfold media, such as any of the fanfold media 400, 500, 600 and 700 of FIGS. 4A, 4B, 5A, 5B, 6A, 6B, 7A, and 7B. As shown in FIG. 8, the first apparatus 800 may comprise a feed or unwind roll 802, which roll may comprise, for example, a web of one-sided thermal media 100. As further shown in FIG. 8, the web of media 100 is fed from the unwind roll 802 to a web tensioning and control device 810 which maintains a proper tension on the web of media 100. It should be noted that multiple web tensioning and control devices 810 may be provided in various locations (e.g., before and/or after an individual print tower 820, 840) in various embodiments of an apparatus 800.

Following the web tensioning and control 810, the apparatus 800 may comprise one or more print units or towers 820, 840 which units are adapted to print and/or apply one or more inks or coatings on or to one or both sides 102, 104 of a fed web of media 100. In the embodiment of FIG. 8, two print towers 820, 840 are provided to print and/or apply an ink or a coating to a first side 102 of fed, one-sided media 100. It should be noted that in other embodiments, additional print towers 820, 840 may be provided to further print and/or coat one or both sides 102, 104 of the web of media 100.

As shown in FIG. 8, each of the print towers 820, 840 may comprise a roller 822, 842 (e.g., an anilox roller) for applying an ink or coating 824, 844 to one or more relief surfaces 826, 846 associated with a respective plate cylinder 828, 848. Depending on the embodiment, each of the one or more relief surfaces 826, 846 may be provided on a flexible relief plate (not shown) installed on a respective plate cylinder 828, 848. Subsequently, each of the wetted relief surfaces 826, 846 transfers their respective ink or coating to a respective portion of the top surface 102 of the media web 100 by which printing and/or coating is provided. Back-up (e.g., impression) rollers 830, 850 are provided to maintain the media web 100 pressed against the respective relief surfaces 826, 846 of the plate cylinders 828, 848.

In one embodiment, a first print tower 820 is provided for press pre-printing of a first side 102 of a fed web of media in the form of one-sided direct thermal media 100 having a single thermally sensitive coating 120 thereon, and a second print tower 840 is provided to selectively apply an overcoat 560, 570, 660, 670, 760, 770 on top of the thermally sensitive coating 120 and/or press pre-printing.

As shown in FIG. 8, an overcoat 844 may be applied to a portion of the first side 102 of the web of one-sided media 100 by the second print tower 840, consistent with the coverage provided by the included relief surfaces 846. As disclosed hereinabove, such application may be limited to regions or bands of the web of media 100 where fanfolding and/or perforating are to occur. However, it should be noted that a flood or full coat of overcoat material 844 may be also be applied by suitably designing the relief surfaces 846 to cover the full circumference of the plate cylinder 848.

Variation, such as where print and/or overcoat coverage is limited to less than the full width of the web of media 100, is also possible. Likewise, while timing of the printing and/or coating process and location of the respective inks and/or coatings on the web of media 100 may generally be determined by fixed relation between the relief surface 826, 846 number and size, and plate cylinder 828, 848 diameter/circumference, variations such as initiating printing and/or coating in response to the sense of one or more sense or other timing marks 450, 750 by one or more sensors (not shown) associated with the print towers 820, 840 and/or print apparatus 800, are also possible.

Likewise, it should be noted that in other embodiments, one or more turning units (not shown) comprising, for example, one or more turnbars, may be provided between one or more print towers 820, 840 to turn the web of media 100 and permit printing and/or coating to occur on both of a first and a second side 102, 104 thereof.

As disclosed hereinabove, a suitable overcoat 844 may need to be compatible with the subject media 100, including any sub, thermally sensitive, top or other coatings provided thereon, and/or any desired or required print means (e.g., direct thermal, thermal transfer, inkjet, laser, and the like), while mitigating unwanted debris generation and deposit issues such that the overcoat 844 does not, for example, cause premature imaging and/or deactivation of one or more provided thermally sensitive coatings. Suitable overcoats may include materials having properties as described hereinabove with respect to FIGS. 5A and 5B, including material(s) described with respect to any specifically disclosed embodiments.

As further shown in FIG. 8, a print apparatus 800 may further comprise one or more finishing units 860, 870 following the one or more print towers 820, 840. In one embodiment, a first finishing unit may be provided in the form of a perforation unit 860 for providing, inter alia, perforations running across the width of the web of media 100 (e.g., into the page of the schematic of FIG. 8). Likewise, in a further embodiment, a second finishing unit may be provided in the form of a folding unit 870 for fanfolding the web of media 100 in a similar, width-wise direction. Where both a perforating 860 and a fanfolding 870 unit are provided, the folding unit 870 will typically fanfold the web of media 100 at locations where cross-web perforations have been provided by the perforation unit 860, although variations are possible. In other embodiments, one or the other of a perforation unit 860 or a fanfolding unit 870 may be provided as part, or used during operation of an apparatus 800.

Further, in some embodiments, a cutting unit 880 may be provided to cut a web of printed, coated, perforated and/or fanfolded media 100 width-wise (e.g., slit) and/or lengthwise depending on an unwind media roll 802 width and/or length, and a desired end-use size. Likewise, in some embodiments, a stacking unit 890 may be provided to generate appropriate size stacks of fanfolded media 100 for subsequent use. It should be noted that, depending on the embodiment, cutting 880 and stacking 890 means may be provided as part of a fanfold 870 or other apparatus 800 unit. Additionally, in alternate embodiments, a rewind roll 895 may be provided in place of, for example, a stacking unit 890 wherein subsequent use of printed, coated, perforated and/or fanfolded media 100 so requires.

Figure 9:
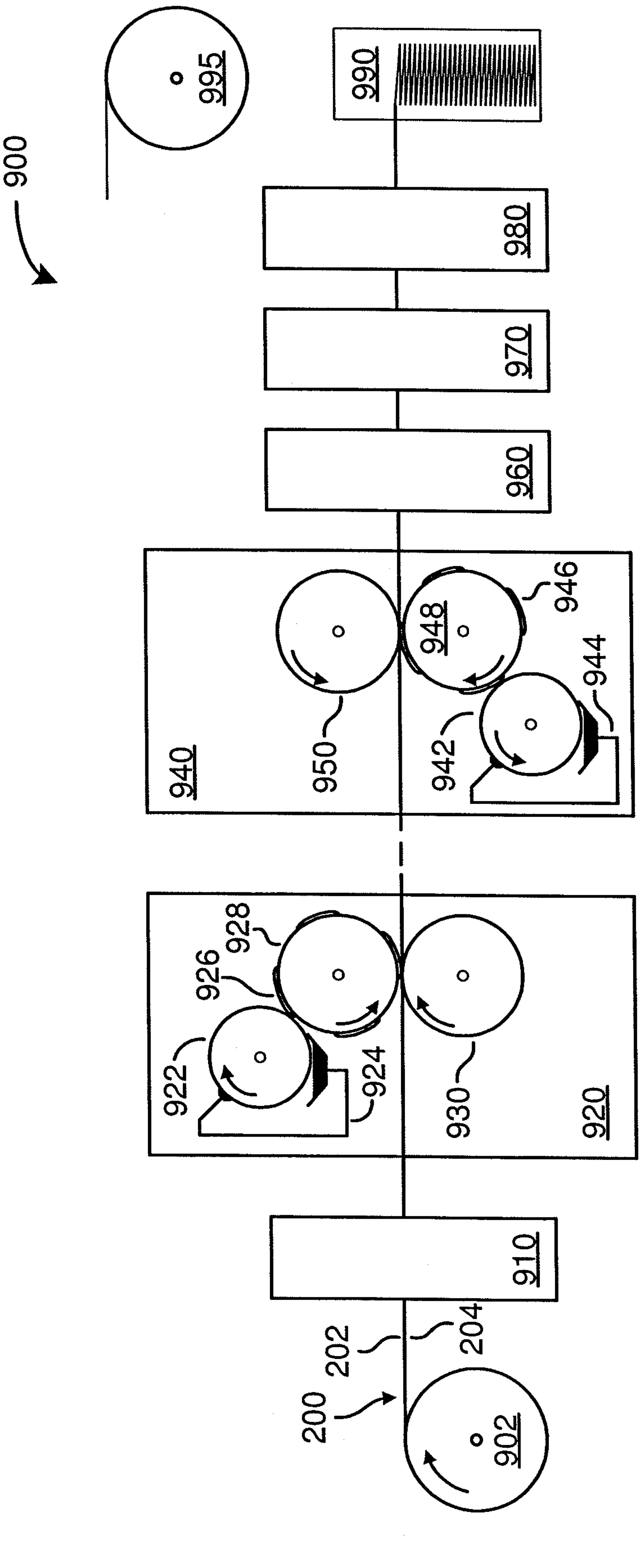
FIG. 9 provides a schematic of a second apparatus for making fanfold media.

FIG. 9 provides a schematic of a second apparatus 900 for making fanfold media, such as any of the fanfold media 400, 500, 600 and 700 of FIGS. 4A, 4B, 5A, 5B, 6A, 6B, 7A, and 7B. As shown in FIG. 9, the second apparatus 900 may comprise a feed or unwind roll 902, which roll may comprise, for example, a web of two-sided thermal media 200. As further shown in FIG. 9, the web of media 200 is fed from the unwind roll 902 to a web tensioning and control device 910 which maintains a proper tension on the web of media 200. It should be noted that multiple web tensioning and control devices 910 may be provided in various locations (e.g., before and/or after an individual print tower 920, 940) in various embodiments of an apparatus 900.

Following the web tensioning and control 910, the apparatus 900 may comprise one or more print units or towers 920, 940 which units are adapted to print and/or apply one or more inks or coatings to one or both sides 202, 204 of a fed web of media 200. In the embodiment of FIG. 9, two print towers 920, 940 are provided to apply one or more inks and/or coatings 924, 944 to a first and a second side 202, 204 of fed, two-sided media 200. It should be noted that in other embodiments, additional print towers 920, 940 may be provided to further print and/or coat one or both sides of the fed web of media 200.

As shown in FIG. 9, each of the print towers 920, 940 may comprise a roller 922, 942 (e.g., an anilox roller) for applying an ink or coating 924, 944 to one or more relief surfaces 926, 946 associated with a respective plate cylinder 928, 948. Depending on the embodiment, each of the one or more relief surfaces 826, 846 may be provided on a flexible relief plate (not shown) installed on a respective plate cylinder 828, 848. Subsequently, each of the wetted relief surfaces 926, 946 transfers their respective ink or coating to a respective portion of the top and bottom surfaces 202, 204 of the media web 200 by which printing and/or coating is provided. Back-up (e.g., impression) rollers 930, 950 are provided to maintain the media web 200 pressed against the respective relief surfaces 926, 946 of the plate cylinders 928, 948.

In one embodiment, a first print tower 920 is provided for selectively applying a first overcoat 924 (e.g., apply an overcoat 560, 660, 760 as shown in FIGS. 5B, 6B, and 7B) on a first side 202 of a fed web of media in the form of two-sided direct thermal media 200, and a second print tower 940 is provided to selectively apply a second overcoat 944 (e.g., apply an overcoat 570, 670, 770 as shown in FIGS. 5B, 6B and 7B) on a second side 204 of the fed web of media 200. In alternate embodiments, one or more additional print towers 920, 940 may be provided to, for example, press preprint one or more sides 202, 204 of the web of media 200.

As shown in FIG. 9, an overcoat 924, 944 may be applied to a portion of the first and/or second sides 202, 204 of the web of two-sided media 200 by the first and second print towers 920, 940, consistent with the coverage of the provided relief surfaces 926, 946. As disclosed hereinabove, such application may be limited to regions or bands of the web of media 200 where fanfolding and/or perforating are to occur. However, it should be noted that a flood or full coat of overcoat material may be also be applied by suitably designing the relief surfaces 926, 946 to cover the full circumference of the respective plate cylinders 928, 948.

Variation, such as where print and/or overcoat coverage is limited to less than the full width of the web of media 200, is also possible. Likewise, while timing of the printing and/or coating process and location of the respective inks and/or coatings on the web of media 200 may generally be determined by fixed relation between the relief surface 926, 946 number and size, and plate cylinder 928, 948 diameter/circumference, variations such as initiating printing and/or coating in response to the sense of one or more sense or other timing marks 450, 750 by one or more sensors (not shown) associated with the print towers 920, 940 and/or print apparatus 900, are also possible.

As disclosed hereinabove, a suitable overcoat 924, 944 may need to be compatible with the subject media 200, including any sub, thermally sensitive, top or other coatings provided thereon, and/or any desired or required print means (e.g., direct thermal, thermal transfer, inkjet, laser, and the like), while mitigating unwanted debris generation and deposit issues such that the overcoat 924, 944 does not, for example, cause premature imaging and/or deactivation of one or more provided thermally sensitive coatings. Suitable overcoats may include materials having properties as described hereinabove with respect to FIGS. 5A and 5B, including material(s) described with respect to any specifically disclosed embodiments.

As further shown in FIG. 9, a print apparatus 900 may further comprise one or more finishing units 960, 970 following the one or more print towers 920, 940. In one embodiment, a first finishing unit may be provided in the form of a perforation unit 960 for providing, inter alia, perforations running across the width of the web of media 200 (e.g., into the page of the schematic of FIG. 9). Likewise, in a further embodiment, a second finishing unit may be provided in the form of a folding unit 970 for fanfolding the web of media 200 in a similar, width-wise direction. Where both a perforating 860 and a fanfolding 870 unit are provided, the folding unit 970 will typically fanfold the web of media 200 at locations where cross-web perforations have been provided by the perforation unit 960, although variations are possible. In other embodiments, one or the other of a perforation unit 960 or a folding unit 970 may be provided as part, or used during operation of an apparatus 900.

Further, in some embodiments, a cutting unit 980 may be provided to cut a web of printed, coated, perforated and/or fanfolded media 200 width-wise (e.g., slit) and/or length-wise depending on an unwind media roll 902 width and/or length, and a desired end-use size. Likewise, in some embodiments, a stacking unit 990 may be provided to generate appropriate size stacks of fanfolded media 200 for subsequent use. It should be noted that, depending on the embodiment, cutting 980 and stacking 990 means may be provided as part of a fanfold 970 or other apparatus 900 unit. Additionally, in alternate embodiments, a rewind roll 995 may be provided in place of, for example, a stacking unit 990 wherein subsequent use of the printed, coated, perforated and/or fanfolded media 200 so requires.

Figure 10:
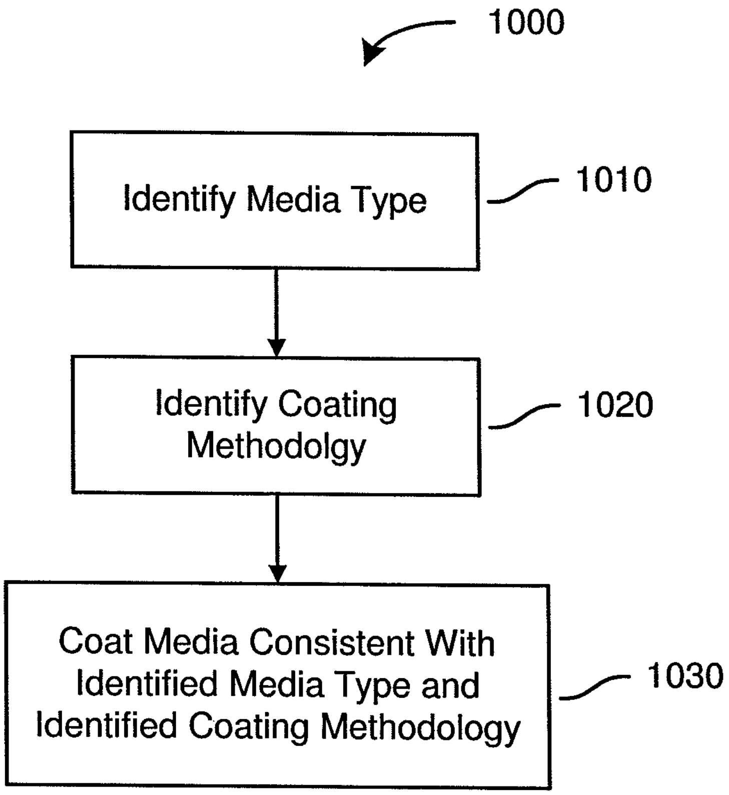
FIG. 10 illustrates a method of applying overcoat to media.

FIG. 10 illustrates a method 1000 of applying overcoat to media. As shown in FIG. 10, the method 1000 may comprise the step 1010 of identifying a media type. Such identification may comprise, inter alia, identifying whether the media has a friable coating on a first and/or a second side thereof such as, but not limited to, identifying whether the media comprises one- or two-sided direct thermal media 100, 200 as described with respect to FIGS. 1 and 2. Likewise, the step 1010 of identifying a media type may further comprise identifying a type of substrate 110, 210, 410, 510, 610, 710 used in the media (e.g., cellulose, polypropylene, polyethylene, combinations thereof, and the like), as well as physical and/or mechanical properties thereof such as thickness or basis weight.

As also shown in FIG. 10, a method 1000 of applying overcoat to media may further comprise the step 1020 of identifying an overcoat methodology. Such identification may comprise, inter alia, identifying whether to apply a full or flood overcoat, a spot or stripe overcoat, and the like. In the case of a non-full or a non-flood type overcoat, the dimensions of the overcoat (e.g., length and width) may further be identified, either independently or, as is discussed further hereinbelow, as a function of the type of media installed, thereby being responsive thereto.

A method 1000 of applying overcoat to media may further comprise the step 1030 of overcoating the media consistent with the identified media type and the identified overcoat methodology. Such step may comprise overcoating media identified as having a friable coating on a single side thereof, such as the one-sided direct thermal media 100 of FIG. 1, on the side 102 having such friable coating. Likewise, such step may comprise overcoating media identified as having a friable coating on both of a first and a second side thereof, such as the two-sided direct thermal media 200 of FIG. 2, on both sides 202, 204 thereof. Variations, such as overcoating media in spot and/or stripe patterns proximate to where one or more convex and/or concave fanfolds are to be, or have already been made, such as described hereinabove with respect to FIGS. 6A, 6B, 7A and 7B, are also possible.

Similarly, a method 1000 of applying overcoat to media may vary with media type wherein, for example, a width of a stripe of overcoat (e.g., twice the length, L, of FIGS. 6A and 7A) may vary with a type of media (e.g., cellulosic, polypropylene, polyethylene, combinations thereof, and the like), or vary with the thickness of the substrate such that the width of a stripe of overcoat increases (e.g., linearly) with the thickness of the media substrate, and vice-versa.

The above description is illustrative, and not restrictive. In particular, a type of media on which an overcoat is provided may vary to include, inter alia, thermal transfer, inkjet, laser and like media having one or more thermal transfer, inkjet, laser and like coating which is or becomes friable upon application of stress during perforating and/or fanfolding processes.

Further, many other embodiments will be apparent to those of skill in the art upon reviewing the above description. The scope of the embodiments should therefore be determined with reference to the appended claims, along with the full scope of equivalents to which such claims are entitled.

In the foregoing description of the embodiments, various features are grouped together in a single embodiment for the purpose of streamlining the disclosure. Likewise, various features are described only with respect to a single embodiment in order to avoid undue repetition. This method of disclosure is not to be interpreted as reflecting that the claimed embodiments should have more or less features than are expressly recited in each claim. Rather, as the claims reflect, inventive subject matter lies in more or less than all features of a single disclosed embodiment. Thus the claims are hereby incorporated into the description of the embodiments, with each claim standing on its own as a separate exemplary embodiment.

What is claimed is:

1. An apparatus for fanfolding media having a first and a second side, the apparatus comprising:

a first sensor associated with a first print tower; said first sensor adapted to identify whether the media includes a friable coating on the first side thereof; and said first print tower comprising an anilox roller, a plate cylinder having a relief surface, and an impression roller, the first print tower being adapted to apply an overcoat to a portion of the friable coating on the first side of the media in response to said friable coating being identified thereon by the first sensor; wherein a thermally sensitive coating is the friable coating; and said first print tower is configured to apply said overcoat with sufficiently low thermal resistivity on said first media side to permit heat applied by a thermal printer to image the thermally sensitive coating therethrough.

2. The apparatus of claim 1, further comprising:

a second sensor adapted to identify whether the media includes a friable coating on the second side thereof, said second sensor associated with a second print tower; and said second print tower adapted to apply an overcoat to a portion of the friable coating on the second side of the media in response to friable coating being identified thereon by the second sensor.

3. The apparatus of claim 1, further comprising:

a folding unit adapted to fold the media proximate to the portion of the first media side where the first print tower is adapted to apply the overcoat.

4. The apparatus of claim 1, further comprising:

a perforating unit adapted to perforate the media proximate to the portion of the first media side where the first print tower is adapted to apply the overcoat.

5. The apparatus of claim 3, further comprising:

a perforating unit adapted to perforate the media coincident with where the folding unit is adapted to fold the media.

6. The apparatus of claim 3, wherein the first print tower is adapted to apply a first series of stripes of overcoat to the first media side in response to friable coating being identified thereon by the first sensor, and the folding unit is adapted to fold the media about the centerline of each of the applied first series of stripes.

7. The apparatus of claim 6, wherein the second print tower is adapted to apply a second series of stripes of overcoat to the second media side, interspersed with the first series of stripes, in response to friable coating being identified thereon by the second sensor, and the folding unit is adapted to fold the media about the centerline of each of the applied second series of stripes in a direction opposite to the fold of the media about the first series of stripes.

8. The apparatus of claim 4, wherein the second print tower is adapted to apply a second series of stripes of overcoat to the second media side, opposite the first series of stripes, in response to friable coating being identified on the second media side by the second sensor and the folding unit is adapted to alternately change direction of the fold of the media about the centerline of each of the applied first series of stripes.

9. An apparatus for fanfolding media having a first and a second side, the apparatus comprising: a first print tower adapted to apply print on a first media side of the media; a sensor adapted to identify whether the media includes a friable coating on the first side thereof; said sensor associated with a second print tower; said second print tower comprising an anilox roller, a plate cylinder having a relief surface, and an impression roller, the second print tower being adapted to apply an overcoat to a portion of the friable coating on the first media side in response to the friable coating being identified thereon by the sensor following printing by the first print tower; and a folding unit for folding the media in the portion following application of the overcoat by the second print tower wherein a thermally sensitive coating is the friable coating; and said second print tower is configured to apply said overcoat with sufficiently low thermal resistivity on said first media side to permit heat applied by a thermal printer to image the thermally sensitive coating therethrough.

10. The apparatus of claim 3 wherein the overcoat comprises a material having a viscosity in the range of 130 to 230 centipoise at 77 F, a solids content in the range of 33% to 55%, and a pH in the range of 7 to 10 during application thereof to the first media side.

11. The apparatus of claim 3 wherein the overcoat comprises a material having a viscosity in the range of 150 to 200 centipoise at 77 F, a solids content in the range of 34% to 40%, and a pH in the range of 9 to 10 during application thereof to the first media side.

12. The apparatus of claim 3 wherein the overcoat comprises a material having a viscosity in the range of 165 to 185 centipoise at 77 F, a solids content in the range of 35% to 37%, and a pH in the range of 9.2 to 9.8 during application thereof to the first media side.

13. The apparatus of claim 3 wherein the overcoat comprises a material that provides water, scuff and UV resistance.

14. The apparatus of claim 3 wherein the overcoat does not soften below 150 degrees Celsius.

15. The apparatus of claim 3 wherein the overcoat does not soften below 100 degrees Celsius.

* * * * *